(12) United States Patent
Gaertner

(10) Patent No.: US 9,982,714 B2
(45) Date of Patent: May 29, 2018

(54) METHOD FOR PRODUCING A BI-MATERIAL SLIDING BEARING

(71) Applicant: Miba Gleitlager Austria GmbH, Laakirchen (AT)

(72) Inventor: Walter Gaertner, Gmunden (AT)

(73) Assignee: Miba Gleitlager Austria GmbH, Laakirchen (AT)

( * ) Notice: Subject to any disclaimer, the term of this patent is extended or adjusted under 35 U.S.C. 154(b) by 52 days.

(21) Appl. No.: 15/115,372

(22) PCT Filed: Jan. 28, 2015

(86) PCT No.: PCT/AT2015/050027
§ 371 (c)(1),
(2) Date: Jul. 29, 2016

(87) PCT Pub. No.: WO2015/113093
PCT Pub. Date: Aug. 6, 2015

(65) Prior Publication Data
US 2017/0009811 A1 Jan. 12, 2017

(30) Foreign Application Priority Data
Jan. 31, 2014 (AT) .............................. A 50071/2014

(51) Int. Cl.
*F16C 33/18* (2006.01)
*F16C 33/14* (2006.01)
(Continued)

(52) U.S. Cl.
CPC .............. *F16C 33/14* (2013.01); *C23C 14/16* (2013.01); *C23C 14/30* (2013.01); *C23C 14/32* (2013.01);
(Continued)

(58) Field of Classification Search
CPC ........ F16C 17/02; F16C 33/06; F16C 33/124; F16C 33/125; F16C 33/128;
(Continued)

(56) References Cited

U.S. PATENT DOCUMENTS

| | | | |
|---|---|---|---|
| 4,425,247 | A | 1/1984 | Bely et al. |
| 5,300,368 | A | 4/1994 | Kuebert et al. |

(Continued)

FOREIGN PATENT DOCUMENTS

| | | |
|---|---|---|
| AT | 501 722 A4 | 11/2006 |
| CN | 1415865 A | 5/2003 |

(Continued)

OTHER PUBLICATIONS

International Search Report of PCT/AT2015/050027, dated May 12, 2015.

*Primary Examiner* — Phillip A Johnson
(74) *Attorney, Agent, or Firm* — Collard & Roe, P.C.

(57) ABSTRACT

The invention relates to a method for producing a bi-material sliding bearing (1) whereby a metal sliding layer (3) of at least two different particle types is deposited under reduced pressure from the gas phase on a flat, metal substrate (8), and a first particle type forms a matrix with first grains and the second particle type forms grains embedded in the matrix of the metal sliding layer (3), and the metal sliding layer (3) is produced with a thickness (4) of more than 250 μm and with a Vickers hardness below 100 HV(0.025), and the metal sliding layer (3) is made of a single layer in only one pass and with a maximum grain size of at most 1 μm for at least 90% of the first grains forming the matrix and with a maximum grain size for at least 90% of the embedded grains, and a maximum particle size of at most 1.5 μm for the remaining grains making up 100% of all grains.

13 Claims, 2 Drawing Sheets

Figure 1:
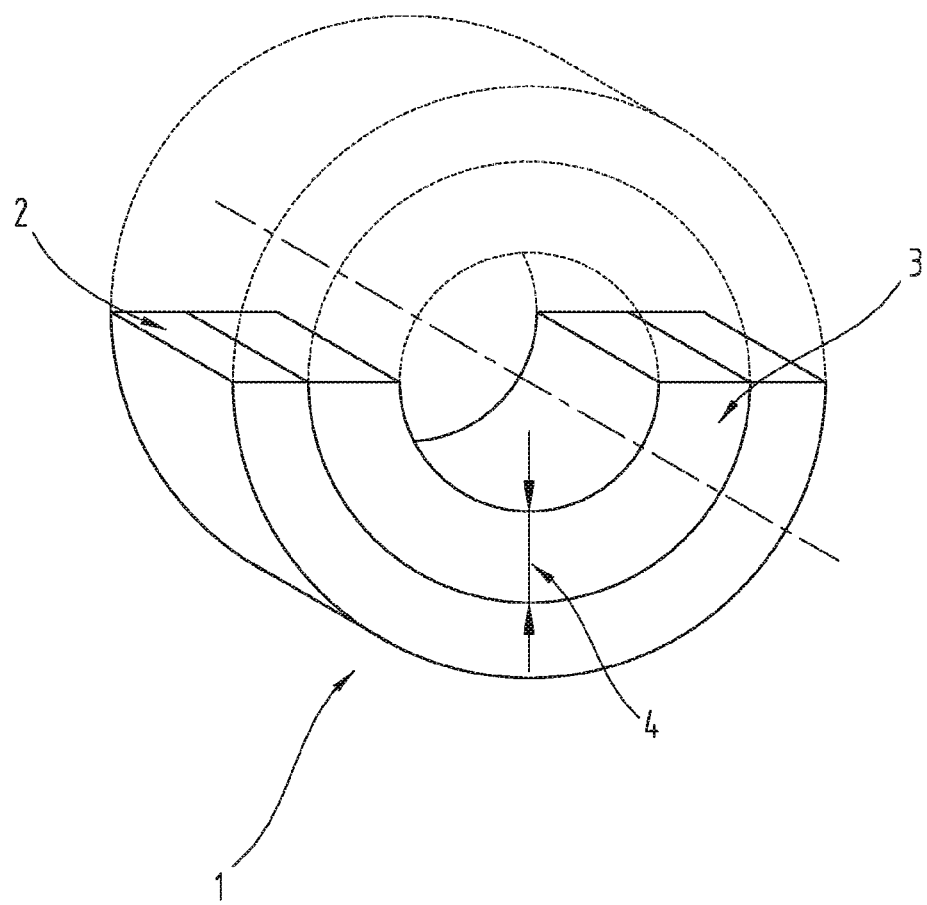

(51) Int. Cl.
*C23C 14/16* (2006.01)
*C23C 14/30* (2006.01)
*F16C 33/12* (2006.01)
*C23C 14/32* (2006.01)

(52) U.S. Cl.
CPC ........ *F16C 33/125* (2013.01); *F16C 2202/04* (2013.01); *F16C 2220/20* (2013.01); *F16C 2223/30* (2013.01); *F16C 2223/60* (2013.01); *F16C 2240/60* (2013.01)

(58) Field of Classification Search
CPC .............. F16C 2201/04; F16C 2220/20; F16C 2223/30; F16C 2223/60; F16C 2240/60; C23C 14/14; C23C 14/16; C23C 14/30; C23C 14/32
See application file for complete search history.

(56) References Cited

U.S. PATENT DOCUMENTS

| | | | |
|---|---|---|---|
| 5,573,392 A | 11/1996 | Paikert et al. | |
| 5,955,202 A | 9/1999 | Steeg et al. | |
| 6,139,191 A * | 10/2000 | Andler | C23C 14/06 384/276 |
| 6,316,061 B1 | 11/2001 | Andler et al. | |
| 6,416,877 B1 | 7/2002 | Perrin et al. | |
| 7,781,015 B2 | 8/2010 | Eitzinger | |
| 8,020,529 B2 * | 9/2011 | Becker | B21K 1/18 123/193.6 |
| 8,586,513 B2 * | 11/2013 | Zidar | C22C 13/00 384/462 |
| 2003/0081868 A1 | 5/2003 | Law | |
| 2006/0029827 A1 | 2/2006 | Mergen et al. | |
| 2007/0110892 A1 | 5/2007 | Awata et al. | |
| 2010/0260445 A1 | 10/2010 | Gaertner et al. | |
| 2012/0114971 A1 * | 5/2012 | Andler | B22F 7/04 428/647 |
| 2012/0321909 A1 * | 12/2012 | Boeschen | C22C 9/02 428/646 |

FOREIGN PATENT DOCUMENTS

| | | |
|---|---|---|
| DE | 3843927 A1 | 6/1990 |
| DE | 195 14 836 A1 | 10/1996 |
| DE | 198 24 308 C1 | 9/1999 |
| EP | 0 692 674 A2 | 1/1996 |
| JP | 2002-061651 A | 2/2002 |
| WO | 2012/067735 A1 | 5/2012 |

\* cited by examiner

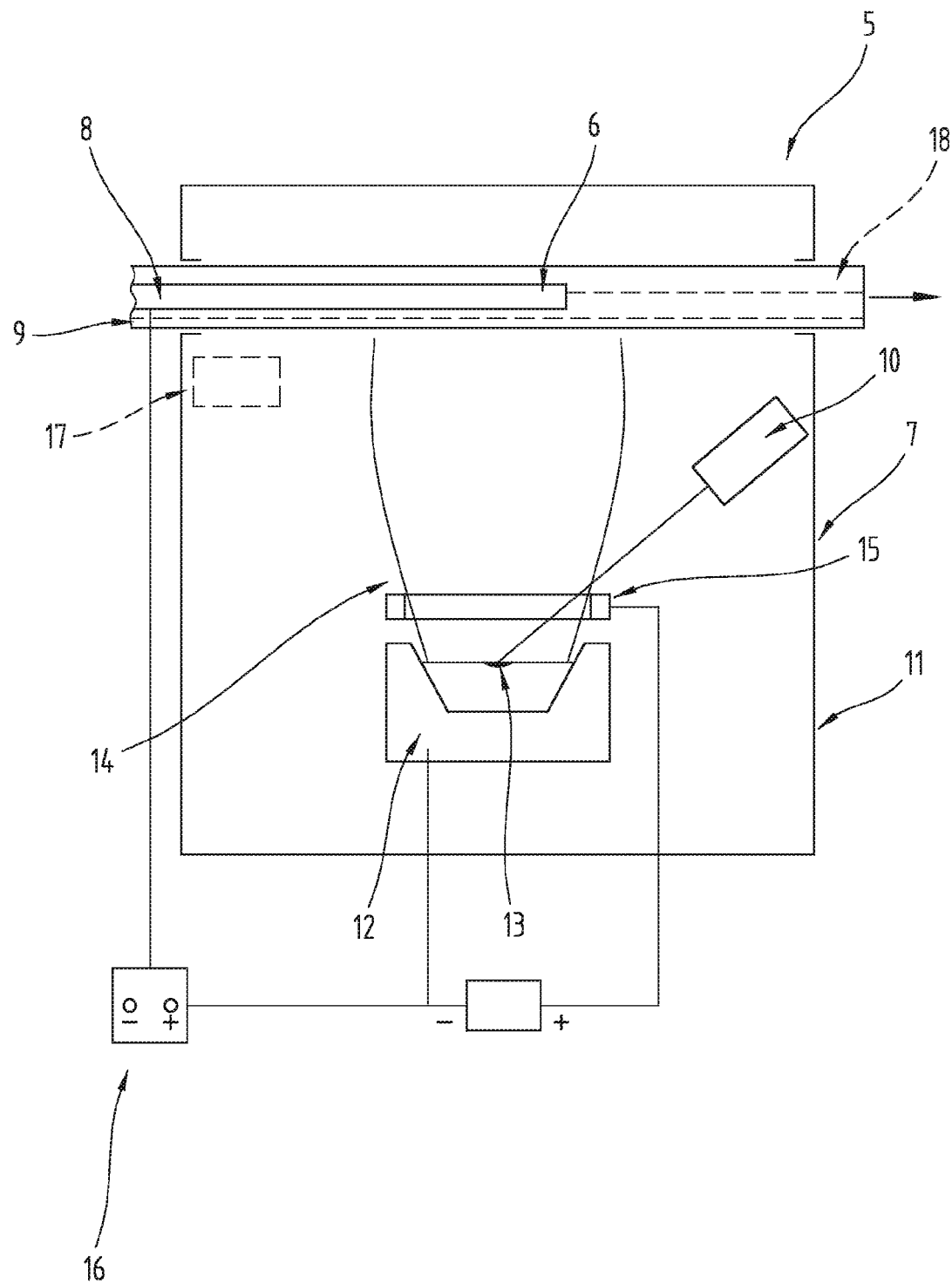

METHOD FOR PRODUCING A BI-MATERIAL SLIDING BEARING

CROSS REFERENCE TO RELATED APPLICATIONS

This application is the National Stage of PCT/AT2015/050027 filed on Jan. 28, 2015, which claims priority under 35 U.S.C. § 119 of Austrian Application No. A 50071/2014 filed on Jan. 31, 2014, the disclosures of which are incorporated by reference. The international application under PCT article 21(2) was not published in English.

The invention relates to a method for producing a bi-material sliding bearing whereby a metal sliding layer made of at least two different particle types is deposited from the gas phase under reduced pressure on a flat metal substrate constituting the supporting layer of the sliding bearing, the particle types being produced by means of at least one electron beam by evaporation from at least one container constituting an evaporation source, and a first particle type forms a matrix with first grains and the second particle type forms grains embedded in the matrix of the metal sliding layer, and after depositing the metal sliding layer, the coated substrate is re-shaped to obtain the sliding bearing, the metal sliding layer being produced with a thickness of more than 250 µm and with a Vickers hardness below 100 HV(0.025).

The invention further relates to a bi-material sliding bearing comprising a metal supporting layer and a metal sliding layer disposed thereon, the metal sliding layer being produced by an electron beam vapor deposition process and comprising a matrix having first grains and second grains embedded in the matrix, and the metal sliding layer also has a thickness of more than 250 µm and a Vickers hardness below 100 HV(0.025).

Use of the electron beam vapor deposition method for producing metal sliding bearings is already known from the prior art. The layers produced using such methods usually have only a slim thickness.

However, an approach is also known from the prior art whereby thick layers can be deposited by means of the electron beam vapor deposition method. For example, AT 501 722 A4 describes a coating method for producing thick sliding layers whereby a metal layer of particles is deposited from the gas phase under reduced pressure on a flat metal substrate held by a substrate holder, the particles being evaporated from at least one container constituting an evaporation source by means of at least one electron beam source. The sliding layer itself is built up of several individual layers in sequence using this method. Although this method offers advantages if concentration gradients of alloy elements have to be created, it does have a disadvantage because it is very difficult to produce homogeneous layers. The sliding layers produced by this method naturally have a pronounced layered structure. This publication mentions the fact that the homogeneity of the deposited sliding layer can be improved by the effects of diffusion and can be so to the degree that the individual layers are macroscopically no longer distinguishable. However, the layered structure nevertheless remains intact and is microscopically detectable.

Thick metal layers, i.e. layers with thicknesses of more than 200 µm, can be produced in the field of sliding bearings for the automotive industry by a direct casting process or by rolling a cast layer. However, due to the production process, they have a relatively coarse-grained structure. The same applies to galvanically produced layers, although the structure of galvanically produced layers contains finer grains than cast layers. Whilst the structure can be refined by adding grain refiner, however, it lags behind the structures that can be produced by means of sputtering in terms of grain size. Sputtering, whereby the particles are produced by bombarding a target with ions, enables very high quality layers with small grain sizes to be produced. The disadvantage, however, is that this method is expensive and the deposition rates which can be achieved are low so that sputtered layers with slim thicknesses are produced, as also pointed out in EP 0 692 674 A2, for example.

Against this background, the objective of the invention is to propose a way to enable a thick metal sliding layer to be produced economically, this layer having properties, at least in the surface region, that are at least to a certain extent more or less comparable with those of layers produced by sputtering.

This objective is achieved by the invention using the method outlined above, whereby the metal sliding layer is made of a single layer in only one pass and with a maximum grain size of at most 1 µm for at least 90% of the first grains forming the matrix and with a maximum grain size for at least 90% of the embedded grains, and with a maximum grain size of at most 1.5 µm for the remaining grains, and in the case of the bi-material sliding bearing outlined above, the metal sliding layer comprises a single layer and at least 90% of the first and second grains of the metal sliding layer have a maximum grain size of at most 1 µm and the remaining grains have a maximum grain size of at most 1.5 µm.

The advantage of this is that it enables a bi-material sliding bearing to be produced, the sliding layer of which is capable of withstanding high loads, is adaptable and ductile, and which has a homogeneous structure across the thickness. Due to the fine grain size, the sliding layer has properties, at least in the surface region, that are at least more or less comparable with those of bearings made by sputtering. Accordingly, a sliding bearing can be produced which, in comparison with conventional sliding bearings with cast sliding layers, is capable of withstanding higher loads, has better tribological properties than sliding layers produced by sputtering, and the wear of which during operation comes close to the wear of sliding layers produced by sputtering. Furthermore, a sliding bearing can be made with a relatively thick sliding layer more economically than a sputter bearing. As a result of the invention, therefore, a bi-material sliding bearing can be produced which has more or less the same properties as sputter sliding bearings but which is less expensive to produce.

Based on one embodiment of the method, the particles can be activated by means of a plasma. Although this has a disadvantage in that the coating rate is reduced, this disadvantage is out-weighed by the advantage of obtaining a finer-grained and denser structure, as a result of which the wear properties and tribological properties can be improved.

The metal sliding layer is preferably deposited at a static deposition rate of at least 50 µm/min. This enables the ductility and fineness of the grains of the sliding layer to be improved.

Static deposition should be understood as meaning the coating rate at a feed rate of zero.

It is also preferable to move the metal substrate with a linear motion at a speed selected from a range of 0.1 mm/s to 1 mm/s above the at least one evaporation source because this enables the variance in thickness to be reduced. The complexity involved in mechanical finishing of the sliding layer surface, for example the bore of the finish, can thus be reduced.

Based on another embodiment of the method, the metal substrate may be moved at a distance above the at least one evaporator source selected from a range of 200 mm and 500 mm. This firstly enables the tribological properties of the metal sliding layer to be influenced. Secondly, the grain size of the grains can also be influenced because particles can be more easily prevented from colliding on the path to the substrate. In addition, a more uniform thickness of the metal sliding layer can also be obtained across the width of the substrate, in other words transversely to the direction of movement.

Furthermore, the surface of the metal substrate may also be exposed to a plasma prior to coating. This enables the metal surface to be cleaned and/or activated, thereby improving the bond strength of the metal sliding layer deposited on the substrate. This obviates the need for bonding layers and thus simplifies production of the sliding bearing.

The matrix preferably comprises a base element selected from a first group comprising aluminum, tin, copper. These metals in particular have proved to be effective both in terms of their use in sliding bearings, in a manner known per se, and in terms of deposition by means of an electron beam vapor deposition process.

Furthermore, the second grains may comprise at least one element selected from a group comprising tin, bismuth, silicon, magnesium, manganese, iron, scandium, zirconium, chromium, copper, aluminum, antimony, nickel, carbon (graphite), with the proviso that the other element is different from the base element, thereby enabling an appropriate adaptation of the bi-material sliding bearing to the preferred use in HGV engines or heavy-duty motors whilst nevertheless keeping deposition of the metal sliding layer economical. In particular, a combination of the elements aluminum, tin and copper is used because the vapor pressures of these elements are very close to one another.

In this respect, the metal sliding layer may be made from an alloy selected from a group comprising $AlSn_xCu_y$, $AlSn_xSi_y$, $AlBi_x$, $CuSn_x$, $CuBi_x$, $CuSn_xBi_y$, $SnAl_x$, $SnSb_x$, $SnCu_xSb_y$, x and y respectively being a value selected from a range with a lower limit of 1 and an upper limit of 30.

The grain size of the second grains may be at most half the size of the grain size of the first grains. The second grains are preferably grains deposited from the soft phase(s). The fact that these soft phase grains have a smaller grain size than the matrix grains makes it easier to prevent a continuous network of soft phase grains forming, thereby enabling the sliding layer to be made more ductile.

At this stage, it should be pointed out that by soft phase is meant an element having a lower hardness than the matrix. In particular, these elements are tin and bismuth.

It should also be noted that it is also possible for the soft phase to form the matrix, e.g. tin or bismuth (for example in tin-based alloys). In this respect, it may be of advantage if the grain size of the first grains, in other words the matrix, is smaller than or the same as the grain size of the second grains, in other words the grains embedded in the matrix. However, the converse situation would also be possible, in which case the grain size of the first grains is bigger than the grain size of the second grains.

It is also preferable if the first grains forming the matrix and/or the second grains embedded in the matrix have a globular habit and/or the structure as a whole has a globular appearance. This better prevents any potential notch effect of the particles.

As already mentioned above, the metal sliding layer is preferably disposed directly on the metal supporting layer, thereby simplifying production of the sliding bearing and reducing the amount of material consumption. This also enables the sliding layer to be made softer and more ductile because the load is transmitted directly to the supporting layer.

To provide a clearer understanding, the invention will be explained in more detail below with reference to the appended drawings.

These are simplified, schematic diagrams illustrating the following:

FIG. 1 a bi-material sliding bearing in the form of a half-shell viewed from an angle;

FIG. 2 a unit for producing a bimetallic strip.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described.

FIG. 1 illustrates a bi-material sliding bearing 1 in the form of a half-shell. The bi-material sliding bearing 1 comprises a supporting layer 2 and a sliding layer 3 disposed on top of it.

A bi-material sliding bearing 1 should be understood as used in technical parlance to mean a sliding bearing comprising a supporting layer 2 and a sliding layer 3, the sliding layer 3 being the radially inner layer of the sliding bearing on which the component to be mounted slides, for example a shaft. The expression "bi-material sliding bearing" also includes—as standard in technical parlance—sliding bearings with a supporting layer 2 and a sliding layer 3, with at least one other layer in the form of a bonding layer or a diffusion barrier layer disposed in between these two layers. Such layers are not counted in the expression bi-material sliding bearing. In other words, no bearing metal layer made from a bearing metal alloy is disposed between the supporting layer 2 and sliding layer 3. The advantage of this is that no casting or plating steps are necessary for the deposition of a bearing metal layer prior to depositing the sliding layer 3.

It should already be mentioned at this stage that based on the preferred embodiment of the bimaterial sliding bearing 1, the sliding layer 3 is disposed directly on the supporting layer 2, i.e. directly and without any intermediate layers.

Both the supporting layer 2 and the sliding layer 3 are produced from a metal material.

The supporting layer 2 is made in particular from a steel but may also be made from a different metal material that will impart the desired structural strength to the bi-material sliding bearing 1, such as for example bronze, brass, a high-strength aluminum alloy, etc.

The metal sliding layer 3 has a matrix comprising a base element, which is preferably selected from a first group comprising or consisting of aluminum, tin, copper. This base element is the main constituent of the metal alloy of the sliding layer 3 and therefore accounts for the largest proportion of the sliding layer 3 in terms of quantity compared with the other elements in the sliding layer 3 (based on a composition expressed as a % by weight).

At least one other element is embedded in this matrix. This other element is preferably selected from a second group comprising or consisting of tin, bismuth, silicon, magnesium, manganese, iron, scandium, zirconium, chromium, copper, aluminum, antimony, nickel, carbon (graphite), with the proviso that the other element is different from the base element. These elements enable the properties of the sliding layer 3 to be adapted to the respective requirements. Since the effects of the individual elements are generally known from the prior art, a description will not be given here, with a view to avoiding unnecessary repetition.

The proportion of each of these elements from the second group in the sliding layer 3 may be selected from a range of 0.3% by weight to 35% by weight, and the total proportion of all the elements from the second group in the sliding layer 3 is selected from a range of 5% by weight to 40% by weight. The rest making up 100% by weight is the base element from the first group.

In particular, the sliding layer 3 may be made from an alloy selected from a group comprising AlSnxCuy, AlSnxSiy, AlBix, CuSnx, CuBix, CuSnxBiy, SnAlx, SnSbx, SnCuxSby, where x and y respectively stand for a value selected from a range with a lower limit of 1 and an upper limit of 30, preferably from a range with a lower limit of 2 and an upper limit of 15.

If an intermediate layer is to be provided between the supporting layer 2 and sliding layer 3—but as mentioned above, this is not the preferred embodiment of the invention—it might be made from the matrix component of the alloy of the sliding layer 3 (the base element), for example, iron, an iron alloy, nickel, a nickel alloy, cobalt, a cobalt alloy, pure aluminum, etc. Such intermediate layers (bonding layers and/or diffusion barrier layers) are also known from the relevant prior art, from which other examples of materials for these layers are also known, and reference may therefore also be made to the relevant literature.

The metal sliding layer 3 is produced and deposited on the supporting layer 2 using an electron beam vapor deposition process, as will be explained in more detail below. Compared with sliding layers made by sputtering, therefore, this is a more economical deposition process.

The sliding layer 3 is deposited in a single pass by the evaporator device and there is therefore no layered structure as is the case with the method based on AT 501 722 A4 mentioned above. Nevertheless, the sliding layer 3 can be produced with a thickness 4 of more than 250 μm, in particular more than 400 μm. The thickness 4 can effectively be selected from a range of 250 μm to 2000 μm.

After the sliding layer 3 has been deposited, it has a matrix formed by first grains comprising the base element. Embedded in this matrix are second grains formed by at least one element from the second element group and optionally at least one inter-metallic connection comprising elements of the second element group and/or optionally at least one inter-metallic connection comprising an element of the second element group with the base element. For example, the sliding layer 3 therefore has first grains of aluminum as a matrix, in which tin is embedded as second grains.

As a result of the production process described in more detail below, the sliding layer 3 can be produced so that a majority of the grains, preferably all of the grains, of the sliding layer 3, in other words the first and second grains, have a maximum grain size of at most 1 μm, in particular between 0.1 μm and 1 μm, and the sliding layer 3 has a Vickers hardness of less than 100 HV(0.025), in particular between 40 HV(0.025) and 80 HV(0.025).

By maximum grain size is meant the biggest diameter of an individual grain, given an irregular habit. Due to the production process, however, individual grains may be slightly bigger than 1 μm, although at least 90%, in particular at least 95%, of all the grains will have a grain size of at most 1 μm and the rest of the grains a maximum grain size of 1.5 μm.

Based on a preferred, the grain size of the second grains is at most half the size of the grain size of the first grains, in other words the grains of the matrix.

For the reasons outlined above, it is also preferable if the first grains constituting the matrix and/or the second grains embedded in the matrix have a globular habit. It is more particularly preferable if all of the first and/or second grains have a globular habit. However, it is also possible for only at least 90%, in particular at least 95%, of all the first and/or second grains to have an at least approximately globular habit and the rest of the grains have a habit that is different therefrom.

As may be seen from FIG. 1, the bi-material sliding bearing 1 preferably has the shape of a half-shell. As indicated by broken lines in FIG. 1, however, it would also be possible for the bi-material sliding bearing 1 to be based on a bushing design. Other shapes of bi-material sliding bearings 1 are also possible e.g. thrust washers.

FIG. 2 is a diagram of an evaporation system 5 for producing a vaporized primary product 6 for the bi-material sliding bearing 1. It comprises an evaporation chamber 7 which can be evacuated, into which a planar or flat substrate 8 for producing the primary product 6 can be gated via gates, not illustrated, because the sliding layer 3 is deposited in the evaporation chamber 7 at a negative pressure (relative to the normal pressure outside the evaporation chamber 7).

The substrate 8 may be a steel strip or steel sheet.

The substrate 8 can be transported through the evaporation chamber 7 on a conveyor system 9. However, it would also be possible for the substrate 8 to be conveyed though the evaporation chamber 7 without this conveyor system 9, for example if the substrate 8 is a strip or sheet and the requisite size for the bi-material sliding bearing 1 is cut or punched out from the produced primary product 6 after vaporization.

The conveyor system 9 or substrate 8 is driven by means of an appropriate drive device, although this is not illustrated in FIG. 2.

The substrate 8 is moved through the evaporation chamber 7 in a continuous linear motion without stopping.

At least one electron beam source 10 is disposed in the evaporation chamber 7, preferably an axial electron gun. It may have a power of a multiple of 10 kW, e.g. 120 kW. It would naturally also be possible to provide more than one electron beam source 10.

It should also be noted that the positioning of the electron beam source 10 in FIG. 2 is merely an example because it would also be possible to deflect the electron beam emitted by the electron beam source 10 with the aid of electromagnetic fields. For example, the electron beam source may also be integrated in a housing 11 of the evaporation chamber 7 and/or in a mount specifically provided for it in the housing 11, to provide better accessibility for maintenance work, for example.

Disposed inside the housing 11 of the evaporation chamber 7, in particular underneath the substrate 8, is at least one container 12 in which a metal material 13 to be evaporated is disposed, thus constituting the evaporation source. Depending on the composition of the sliding layer 3 to be produced, several other such containers 12 may be provided, in which are disposed the pure metal elements of the different alloy components from which the alloy of the sliding layer 3 is made. However, it would also be possible to provide the alloy in the correct qualitative and quantitative composition already in a container 12 so that the sliding layer 3 can also be produced using only one evaporation source. The different vapor pressures of the elements in terms of obtaining the correct quantitative composition naturally have to be taken into account, which means that the quantitative composition in the at least one container 12 is different from the quantitative composition of the alloy of the sliding layer 3 as a rule. Optionally, it is also possible for several evaporation sources to contain the same metal, i.e. the same coating material, for forming the metal sliding layer 3, in which case these can be disposed one after the other in the conveying direction of the substrate 8.

The electron beam can be directed to the plurality of containers 12 and in particular can jump backwards and forwards between these containers 12. The electron beam can also jump backwards and forwards between two or more points inside a container 12, for example if a container 12 of larger dimensions is used.

In order to create the sliding layer 3, which is preferably made from the alloys mentioned above, at least two different particle types are created, for example a first particle type of aluminum and a second particle type of tin.

The evaporation source(s), i.e. the container or containers 12, may be cooled, e.g. with a fluid, such as for example water, oil, etc. In addition to presenting the material 13 discontinuously, it is also possible to feed it in continuously, e.g. as a strand or wire, for example across the base of the container or containers 12.

By bombarding the metal material 13 or metal materials 13 with electrons from the at least one electron beam source 10, this material 13 evaporates, creating a particle flow 14 in the form of a vapor lobe. The particles from the particle flow 14 collide with the surface of the substrate 8, ultimately forming the sliding layer 3.

For control purposes, the evaporation system 5 may co-operate with a control and regulation unit (not illustrated), to which other components of the evaporation system 5 may also be actively connected.

At least one screen (not illustrated) may be provided between the substrate 8 and/or the evaporation source(s) in order to partially or entirely screen off the particle flow 14, for example to enable a defined coating path. This might be of practical advantage if the sliding layer 3 is produced from metals from several containers 12, for example, so that at least individual ones of these metals can be screened off during evaporation, thereby enabling a specific alloy composition and/or coating composition to be obtained or to create a concentration gradient within the sliding layer 3. For example, it is possible in this manner to create an increasing concentration of soft phase from tin or bismuth, for example, in the direction towards the sliding surface of the sliding layer 3.

The screens may be cooled by water. It would naturally also be possible to use any other type of cooling suitable for this purpose. Furthermore, the screens may be based on any design, e.g. flat and linearly displaceable, split into two parts and pivotable, etc.

In order to obtain a more finely grained sliding layer 3, a device 15 for generating a plasma is disposed between the container 12 and/or containers 12 and the substrate 8, for example a plasma electrode or a hollow cathode. This creates a discharge which ionizes the vaporized particles. To this end, a direct current selected from a range of 10 A to 100 A and a direct voltage selected from a range of −20 V to −100 V may be applied.

It is also possible to apply a bias voltage to the substrate 8, e.g. selected from a range of −30 V to −500 V, which is made available by a power supply device 16.

It is also of advantage to pre-treat the surface of the substrate 8, as indicated by broken lines in the top left-hand quadrant of the housing 11 of the evaporation chamber 7, representing a pre-treatment device 17. This pre-treatment device 17 may be provided in the form of an etching device provided with hot cathodes, for example. The pre-treatment may take the form of corona discharge, etc. The surface of the substrate 8 is preferably subjected to a plasma treatment, in which case the pre-treatment device 17 may comprise a plasma electrode, for example, for creating an arc discharge.

Other pre-treatment methods may also be applied, such as, for example, sputter cleaning or the AEGD method (Arc Enhanced Glow Discharge method) or a pre-treatment by means of a hollow cathode discharge.

Prior to this surface treatment or activation of the surface of the substrate 8, another surface treatment may optionally be run, e.g. in the form of degreasing and/or general cleaning of the substrate 8.

Furthermore, the conveyor system 9 and/or the substrate 8 may be tempered. To this end, a cooling system 18 may be disposed or arranged in the interior of the conveyor system 9 in order to keep the surface of the conveyor system 9 and hence the substrate 8 at a specific temperature level and/or to enable coating with a defined temperature curve. This cooling system 18 may comprise a coolant line, for example, having co-operating connectors for an intake and discharge establishing a flow connection to a co-operating supply system (not illustrated in FIG. 2). Oil, water, air, etc., may be used for cooling purposes and a heat exchanger may optionally be provided for discharging surplus heat from this cooling system 18 to an energy recycling system. However, it would also be possible to provide other cooling systems 18. If a separate conveyor system 9 as described above is not provided, another option is to connect the substrate 8 itself directly to the cooling system 18.

The cooling system 18 enables the coating method to be run on the basis of an exactly controlled temperature and as a result of this coating temperature or coating temperature curve, a homogeneously dense structure of the sliding layer 3 can be obtained.

Another option prior to depositing the sliding layer 3 is to provide the substrate 8 with a coating of bonding agent.

In order to produce the sliding layer 3, a flat substrate 8 is coated in a single pass through the evaporation chamber 7, for which purpose the substrate 8 is moved linearly, continuously and in particular at a constant speed through the evaporation chamber 7. The following general parameters may be used for this purpose:

Electron Gun:
  Acceleration voltage: 20 kV-35 kV
  Beam power of the electron gun: 60 kW to 240 kW
  Substrate temperature: 150° C. to 250° C.
  Process pressure: $2\times10^{-4}$ Pa-$10^{-1}$ Pa
  Deposition: at least 50 μm/min, in particular from 50 μm/min to 100 μm/min
  Conveying speed of the substrate 8: 0.1 mm/s to 1 mm/s, preferably 0.2 mm/s to 0.5 mm/s
  Distance of substrate 8 from the surface of the evaporator source: 200 mm and 500 mm, in particular 250 mm to 350 mm.

Once the substrate 8 has been coated with the sliding layer 3, in other words when the primary product 6 is finished, the bi-material sliding bearing 1 is shaped by mechanical processing. To this end, the correct blanks for the bi-material sliding bearing 1 can optionally be cut or punched out from the primary product 6 if the latter is not of the right size. The flat primary product 6 or blank is then shaped to obtain the respective shape of the sliding bearing, for example to obtain a half-shell or a bush. This shaping may take place in a die or a press or by rolling. If a sliding bearing bush is to be produced, it may be welded or stapled, etc., in a manner known from the prior art. The sliding layer 3 may then optionally be given a finish bore.

Based on a preferred embodiment, the first grains of the metal forming the matrix are at least twice the maximum grain size of the other grains of the other metal embedded in the matrix, as explained above. This is achieved in particular by higher depositions.

Furthermore, the first and/or second grains preferably have a globular habit and/or the entire structure has a globular, i.e. not columnar, appearance, as explained above. This is achieved by applying higher energy, which is made possible in particular by a high coating rate and/or a high substrate temperature and/or by a high bath temperature.

EXAMPLE

Within the scope of the invention, a bi-material sliding bearing 1 with a sliding layer 3 of AlSn20Cu on a supporting layer 2 of steel was produced as follows.

A steel substrate was put through a pre-cleaning process in a plasma ($p_{Ar}$≈0.3 Pa, $P_{AEGD}$≈3 kW, $U_B$≈−1000V, t≈15 minutes).

This cleaned substrate 8 was coated at an initial pressure of less than $2 \cdot 10^{-4}$ Pa in the evaporation chamber 7 using an AlSn14Cu5 alloy in a container 12. An AlSn20Cu alloy was delivered to this container 12 during deposition of the sliding layer 3. The distance between the substrate 8 and the container 12 was 300 mm. The substrate 8 was conveyed through the evaporation chamber 7 on an oil-cooled conveyor device 9 ($T_{Oil,flow}$=145° C.). The other parameters below were used for the deposition:

Electron beam power: 100 kW (so that the surface temperature in the container 12 is set to ca. 1450° C.)

Conveying speed of the substrate 8: 0.3 mm/s

Deposition $R_{stat}$: 50 μm/min

The thickness of the sliding layer 3 was 615±40 μm and the hardness 63 HV(0.025). For test purposes, the sliding layer 3 was bore finished, after which it had a thickness of ca. 400 μm. The maximum grain size of aluminum was ca. 0.9 μm, that of tin ca. 0.4 μm. The remaining grains had a grain size of at most ca. 1.3 μm. The grain sizes were visually determined by means of an optical microscope and/or electron microscope.

The critical corrosion limit was determined as 74 MPa and wear as 5.2 μm (75 MPa, 15 hours). By way of comparison, a bi-material sliding bearing with a sputtered sliding layer has a critical corrosion limit of 62 MPa and wear of 3.7 μm (based on the same test conditions in each case).

The embodiments illustrated as examples represent possible variants of the bi-material sliding bearing 1, and it should be pointed out at this stage that different combinations of the individual embodiments with one another are also possible.

For the sake of good order, finally, it should be pointed out that, in order to provide a clearer understanding of the structure of the bi-material sliding bearing 1 and evaporation system 5, they and their constituent parts are illustrated to a certain extent out of scale and/or on an enlarged scale and/or on a reduced scale.

LIST OF REFERENCE NUMBERS

1 Bi-material sliding bearing
2 Supporting layer
3 Sliding layer
4 Thickness
5 Evaporation system
6 Primary product
7 Evaporation chamber
8 Substrate
9 Conveyor system
10 Electron beam source
11 Housing
12 Container
13 Material
14 Particle flow
15 Device
16 Power supply device
17 Pre-treatment device
18 Cooling system

The invention claimed is:

1. Method for producing a bi-material sliding bearing whereby a metal sliding layer of at least two different particle types is deposited from the gas phase under reduced pressure on a flat, metal substrate constituting the supporting layer of the sliding bearing, the particle types being produced via at least one electron beam by evaporation from at least one container constituting an evaporation source, and a first particle type forms a matrix with first grains and the second particle type forms grains embedded in the matrix of the metal sliding layer, and whereby, after depositing the metal sliding layer so that a coated substrate is formed, the coated substrate is re-shaped to obtain the sliding bearing, the metal sliding layer being produced with a thickness of more than 250 μm and with a Vickers hardness below 100 HV(0.025), wherein the metal sliding layer is made of a single layer in only one pass and with a maximum grain size of at most 1 μm for at least 90% of the first grains forming the matrix and for at least 90% of the embedded grains, and a maximum grain size of at most 1.5 μm for the remaining grains.

2. Method according to claim 1, wherein the particles are activated via a plasma.

3. Method according to claim 1, wherein the metal sliding layer is deposited at a deposition rate of at least 50 μm/min.

4. Method according to claim 1, wherein the metal substrate is moved above the at least one evaporation source with a linear motion at a speed selected from a range of 0.1 mm/s to 1 mm/s.

5. Method according to claim 1, wherein the metal substrate is moved above the at least one evaporator source at a distance selected from a range of 200 mm and 500 mm.

6. Method according to claim 1, wherein the surface of the metal substrate is exposed to a plasma prior to coating.

7. Bi-material sliding bearing comprising a metal supporting layer and a metal sliding layer disposed thereon, the metal sliding layer being produced via an electron beam vapor deposition process, and a matrix having first grains and second grains embedded in the matrix, and the metal sliding layer has a thickness of more than 250 μm and a Vickers hardness below 100 HV(0.025), wherein the metal sliding layer is made of a single layer and at least 90% of the first and second grains of the metal sliding layer have a maximum grain size of at most 1 μm and the remaining grains have a maximum grain size of at most 1.5 μm.

8. Bi-material sliding bearing according to claim 7, wherein the matrix comprises a base element selected from a first group comprising aluminum, tin, copper.

9. Bi-material sliding bearing according to claim 8, wherein the second grains comprise at least one element selected from a group comprising tin, bismuth, silicon, magnesium, manganese, iron, scandium, zirconium, chromium, copper, aluminum, antimony, nickel, carbon (graphite) with the proviso that the other element is different from the base element.

10. Bi-material sliding bearing according to claim 7, wherein the metal sliding layer comprises an alloy selected from a group comprising AlSnxCuy, AlSnxSiy, AlBix, CuSnx, CuBix, CuSnxBiy, SnAlx, SnSbx, SnCuxSby, where x and y respectively stand for a value selected from a range with a lower limit of 1 and an upper limit of 30.

11. Bi-material sliding bearing according to claim 7, wherein the grain size of the second grains is at most half the size of the grain size of the first grains.

12. Bi-material sliding bearing according to claim 7, wherein the first grains constituting the matrix and/or the second grains embedded in the matrix have an at least approximately globular habit.

13. Bi-material sliding bearing according to claim 7, wherein the metal sliding layer is disposed directly on the metal supporting layer.

\* \* \* \* \*